US012684699B2

(12) United States Patent
Liang et al.

(10) Patent No.: US 12,684,699 B2
(45) Date of Patent: Jul. 14, 2026

(54) CIRCUIT BOARD, CHIP ON FILM, DISPLAY APPARATUS AND BONDING METHOD

(71) Applicants: HEFEI BOE DISPLAY TECHNOLOGY CO., LTD., Hefei (CN); BOE TECHNOLOGY GROUP CO., LTD., Beijing (CN)

(72) Inventors: Yunyun Liang, Beijing (CN); Changcheng Liu, Beijing (CN); Jiantao Liu, Beijing (CN); Liugang Zhou, Beijing (CN); Jianwei Sun, Beijing (CN); Liu He, Beijing (CN); Jun Wang, Beijing (CN); Qing Li, Beijing (CN); Yu Quan, Beijing (CN); Yanting Huang, Beijing (CN); Yunlu Chen, Beijing (CN); Zhengru Pan, Beijing (CN)

(73) Assignees: HEFEI BOE DISPLAY TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 324 days.

(21) Appl. No.: 18/560,671

(22) PCT Filed: May 13, 2021

(86) PCT No.: PCT/CN2021/093657
§ 371 (c)(1),
(2) Date: Nov. 13, 2023

(87) PCT Pub. No.: WO2022/236780
PCT Pub. Date: Nov. 17, 2022

(65) Prior Publication Data
US 2024/0298403 A1 Sep. 5, 2024

(51) Int. Cl.
| | |
|---|---|
| *H05K 3/36* | (2006.01) |
| *H05K 1/02* | (2006.01) |
| *H05K 1/189* | (2026.01) |

(52) U.S. Cl.
CPC ........... *H05K 3/361* (2013.01); *H05K 1/0269* (2013.01); *H05K 1/189* (2013.01); *H05K 2201/10128* (2013.01); *H05K 2201/10318* (2013.01)

(58) Field of Classification Search
CPC .. H05K 1/189; H05K 3/361; H05K 2203/166; G09F 9/00
See application file for complete search history.

(56) References Cited

U.S. PATENT DOCUMENTS

| | | | | |
|---|---|---|---|---|
| 2017/0196080 A1* | 7/2017 | Meng | ........................ | H05K 1/14 |
| 2019/0116662 A1* | 4/2019 | Li | ......................... | G02F 1/1309 |

FOREIGN PATENT DOCUMENTS

| | | |
|---|---|---|
| CN | 101060112 A | 10/2007 |
| CN | 101287329 A | 10/2008 |

(Continued)

OTHER PUBLICATIONS

Eckenstein, et al., "Design, Principles, and Testing of a Latching Modular Robot Connector", IEEE/RSJ International Conference on Intelligent Robots and Systems, pp. 2846-2851, 2014.

*Primary Examiner* — Nathan Milakovich
(74) *Attorney, Agent, or Firm* — Nath, Goldberg & Meyer; Joshua B. Goldberg

(57) ABSTRACT

The present disclosure provides a circuit board, a chip on film, a display apparatus and a bonding method. The circuit board has a plurality of bonding regions for bonding with a chip on film, each bonding region includes: a plurality of first pins extending along a first direction and sequentially arranged along a second direction; and at least one first alignment mark group on an arrangement path along which (Continued)

the plurality of first pins are arranged and configured to be aligned with a second alignment mark group of the chip on film in a buckled way, so that the plurality of first pins are bonded and attached to second pins of the chip on film in one-to-one correspondence.

20 Claims, 5 Drawing Sheets

(56) References Cited

FOREIGN PATENT DOCUMENTS

| | | | | | | |
|----|-------------|---|---|---------|------------|-------------|
| CN | 106293190 A | * | 1/2017 | | | |
| CN | 106783664 A | | 5/2017 | | | |
| CN | 107278020 A | | 10/2017 | | | |
| CN | 107329297 A | * | 11/2017 | .......... | G02F | 1/1309 |
| CN | 110967880 A | * | 4/2020 | ........ | G02F | 1/13452 |
| CN | 111081151 A | | 4/2020 | | | |
| CN | 110930866 B | * | 7/2021 | .............. | G09F | 9/00 |
| CN | 113301713 A | * | 8/2021 | .......... | H05K | 1/0266 |
| CN | 113707700 A | * | 11/2021 | .......... | H05K | 1/0266 |
| CN | 215734997 U | * | 2/2022 | | | |
| JP | H05343568 A | | 12/1993 | | | |

* cited by examiner

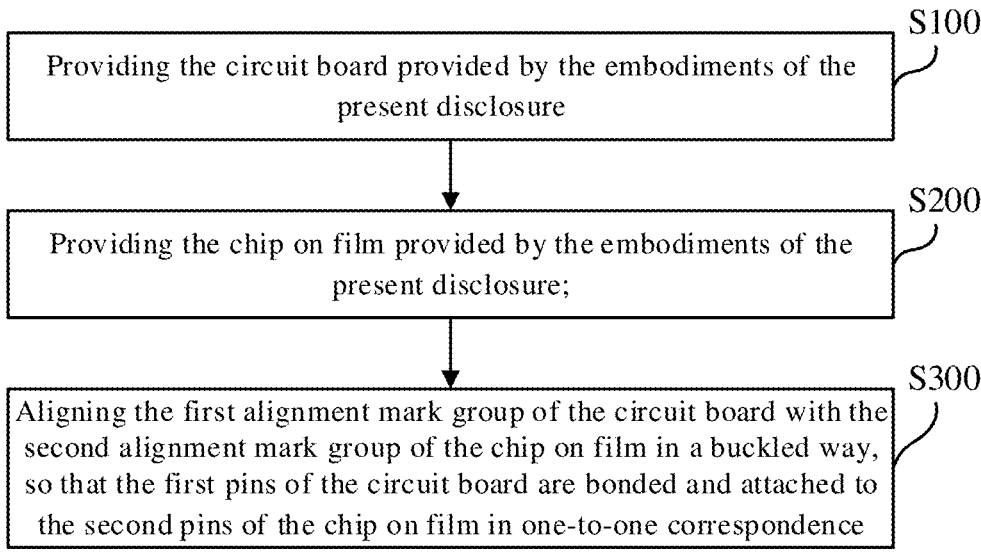

S100

Providing the circuit board provided by the embodiments of the present disclosure

S200

Providing the chip on film provided by the embodiments of the present disclosure;

S300

Aligning the first alignment mark group of the circuit board with the second alignment mark group of the chip on film in a buckled way, so that the first pins of the circuit board are bonded and attached to the second pins of the chip on film in one-to-one correspondence

FIG. 9

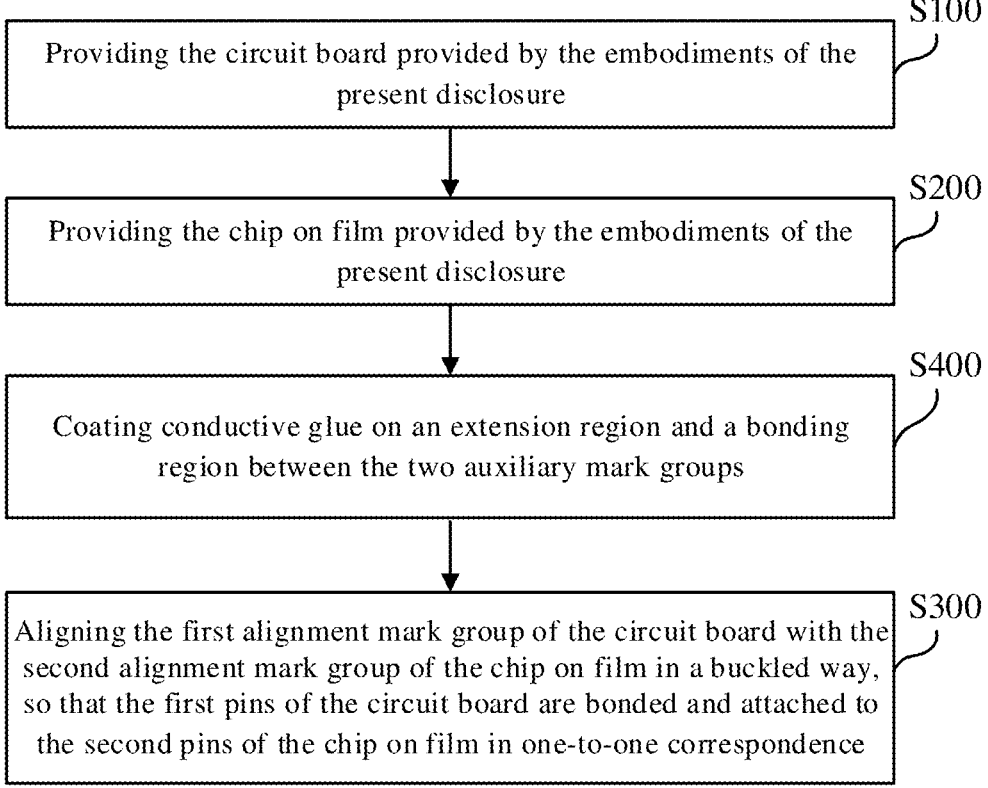

S100

Providing the circuit board provided by the embodiments of the present disclosure

S200

Providing the chip on film provided by the embodiments of the present disclosure

S400

Coating conductive glue on an extension region and a bonding region between the two auxiliary mark groups

S300

Aligning the first alignment mark group of the circuit board with the second alignment mark group of the chip on film in a buckled way, so that the first pins of the circuit board are bonded and attached to the second pins of the chip on film in one-to-one correspondence

FIG. 10

CIRCUIT BOARD, CHIP ON FILM, DISPLAY APPARATUS AND BONDING METHOD

This is a National Phase Application filed under 35 U.S.C. 371 as a national stage of PCT/CN2021/093657, filed May 13, 2021, the content of which is hereby incorporated by reference in its entirety.

TECHNICAL FIELD

The present disclosure relates to the field of semiconductor technology, and in particular to a circuit board, a chip on film, a display apparatus and a bonding method.

BACKGROUND

In a display apparatus, a chip on film (COF) includes one end connected to a printed circuit board (PCB) for receiving data signals from the PCB, and the other end connected to a display panel (Panel) for transmitting data signals output by an integrated circuit (IC) to the Panel and driving the Panel to display.

SUMMARY

The present disclosure provides a circuit board, a chip on film, a display apparatus and a bonding method. The circuit board has a plurality of bonding regions for bonding with a chip on film, and each bonding region includes: a plurality of first pins extending along a first direction and sequentially arranged along a second direction; and at least one first alignment mark group on an arrangement path along which the plurality of first pins are arranged and configured to be aligned with a second alignment mark group of the chip on film in a buckled way, so that the plurality of first pins are bonded and attached to second pins of the chip on film in one-to-one correspondence.

In some embodiments, each first alignment mark group includes a fixture block and strip groups respectively located on two sides of the fixture block along the first direction; each strip group includes at least one first strip extending along the first direction.

In some embodiments, the circuit board includes two first alignment mark groups respectively on two edge regions of the bonding region in the second direction.

In some embodiments, the fixture block has a first symmetry axis parallel to the second direction and passing through a center of the fixture block: first strips on two sides of the fixture block are symmetrically distributed about the first symmetry axis.

In some embodiments, the fixture block has a second symmetry axis parallel to the first direction and passing through a center of the fixture block: the first strips of the same strip group are symmetrically distributed about the second symmetry axis.

In some embodiments, in the same strip group, ends of the first strips away from the fixture block are substantially flush with each other; in the same strip group, ends of the first strips close to the fixture block are substantially flush with each other.

In some embodiments, in the same strip group, an end of each first strip away from the fixture block is substantially flush with an end of each first pin.

In some embodiments, each strip group includes two first strips: in the same strip group, an extension line of an outer edge of one of the first strips away from the other first strip and parallel to the first direction, is substantially coincident with an extension line of an outer edge of the fixture block parallel to the first direction.

In some embodiments, in the same strip group, lengths of the first strips along the first direction are substantially the same: in the same strip group, lengths of the first strips along the second direction are substantially the same.

In some embodiments, a length of the fixture block in the first direction is substantially the same as a length of each first strip in the first direction.

In some embodiments, the length of the fixture block in the first direction is in a range from one fifth to one third of a length of each first pin in the first direction.

In some embodiments, the circuit board further includes extension regions on both sides of the bonding region: each extension region includes: a plurality of floating pins extending along the first direction and sequentially arranged along the second direction, and at least one auxiliary mark group on an arrangement path along which the plurality of floating pins are arranged.

In some embodiments, the display apparatus includes two auxiliary mark groups respectively on two sides of the bonding region: the auxiliary mark groups are used as glue coating mark groups, and conductive glue is coated between the two auxiliary mark groups.

In some embodiments, each auxiliary mark group includes two rectangular auxiliary mark blocks arranged in the first direction.

In some embodiments, a length of each auxiliary mark block in the first direction is in a range from one fifth to one third of the length of each first pin in the first direction: a width of each auxiliary mark block in the second direction is greater than a width of each first pin in the second direction.

In some embodiments, the number of floating pins between each auxiliary mark group and the bonding region is in a range from 8 to 12.

The embodiments of the present disclosure further provide a chip on film, including: a plurality of second pins extending along the first direction and sequentially arranged along the second direction; and at least one second alignment mark group on an arrangement path along which the plurality of second pins are arranged.

In some embodiments, each second alignment mark group includes two second strips extending along the second direction, and one end of each second strip is connected to the same second pin.

In some embodiments, the chip on film includes two second alignment mark groups respectively in two edge regions of the chip on film in the second direction.

In some embodiments, the second strips are connected to a second pin at an edge of the chip on film, and the second pin and the second strips form a notch with an opening towards a side edge of the chip on film.

In some embodiments, the other end of each second strip is substantially flush with the edge of the chip on film.

In some embodiments, each second alignment mark group includes two second strips.

In some embodiments, a width of each second strip in the first direction is substantially the same as a width of each second pin in the second direction.

The embodiments of the present disclosure further provide a display apparatus, including the circuit board according to the embodiment of the present disclosure and the chip on film according to the embodiment of the present disclosure, wherein the first alignment mark group of the circuit board and the second alignment mark group of the chip on film are aligned with each other in a buckled way, so that the plurality of first pins of the circuit board are bonded and attached to the plurality of second pins of the chip on film in one-to-one correspondence.

In some embodiments, each first alignment mark group includes the fixture block and strip groups respectively located on two sides of the fixture block along the first direction: each strip group includes at least one first strip extending along the first direction: each second alignment mark group includes two second strips extending along the second direction, and one end of each second strip is connected to the same second pin; and when the first alignment mark group and the second alignment mark group are aligned with each other in a buckled way, the fixture block is between the adjacent second strips, and each second strip is between the fixture block and the first strip.

In some embodiments, a length of each second strip in the second direction is greater than a length of the fixture block in the second direction; and a distance of a gap between the two second strips in the first direction is greater than a length of the fixture block in the first direction.

In some embodiments, a width of a gap between the first strip and the fixture block in the first direction is greater than a width of each second strip in the first direction.

In some embodiments, every two adjacent N chip on films are bonded to a same circuit board, where N is a positive integer greater than 0.

In some embodiments, the display apparatus further includes a display panel, and a flexible circuit board: the display panel is connected to one end of each chip on film; and two adjacent circuit boards are connected to each other through the flexible circuit board.

The embodiments of the present disclosure further provide a bonding method for the display apparatus according to the embodiments of the present disclosure, including: providing the circuit board according to the embodiments of the present disclosure; providing the chip on film according to the embodiments of the present disclosure; and aligning the first alignment mark group of the circuit board with the second alignment mark group of the chip on film in a buckled way, so that the plurality of first pins of the circuit board are bonded and attached to the plurality of second pins of the chip on film in one-to-one correspondence.

In some embodiments, the circuit board further includes two auxiliary mark groups: before the step of aligning the first alignment mark group of the circuit board with the second alignment mark group of the chip on film in a buckled way, the bonding method further includes: coating conductive glue on an extension region and a bonding region between the two auxiliary mark groups: after the step of aligning the first alignment mark group of the circuit board with the second alignment mark group of the chip on film in a buckled way, the bonding method further includes: attaching the circuit board to the chip on film.

BRIEF DESCRIPTION OF DRAWINGS

FIG. 9 is a flowchart illustrating a bonding method for a display apparatus according to some embodiments of the present disclosure; and FIG. 10 is a flowchart illustrating a bonding method for a display apparatus according to some embodiments of the present disclosure.

DETAIL DESCRIPTION OF EMBODIMENTS

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few, not all of, embodiments of the present disclosure. All other embodiments, which can be derived by a person skilled in the art from the embodiments of the present disclosure without any creative effort, are within the protective scope of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. The term of "comprising/comprise"·"including/includes", or the like, means that the element or item preceding the term contains the element or item listed after the term and its equivalent, but does not exclude other elements or items. The term "connected/connecting", "coupled/coupling", or the like is not limited to physical or mechanical connections, but may include electrical connections, whether direct or indirect connections. The terms "upper/on", "lower/under", "left", "right", and the like are used only for indicating relative positional relationships, and when the absolute position of an object being described is changed, the relative positional relationships may also be changed accordingly.

To make the following description of the embodiments of the present disclosure clear and concise, a detailed description of known functions and known components is omitted from the present disclosure.

Figure 1:
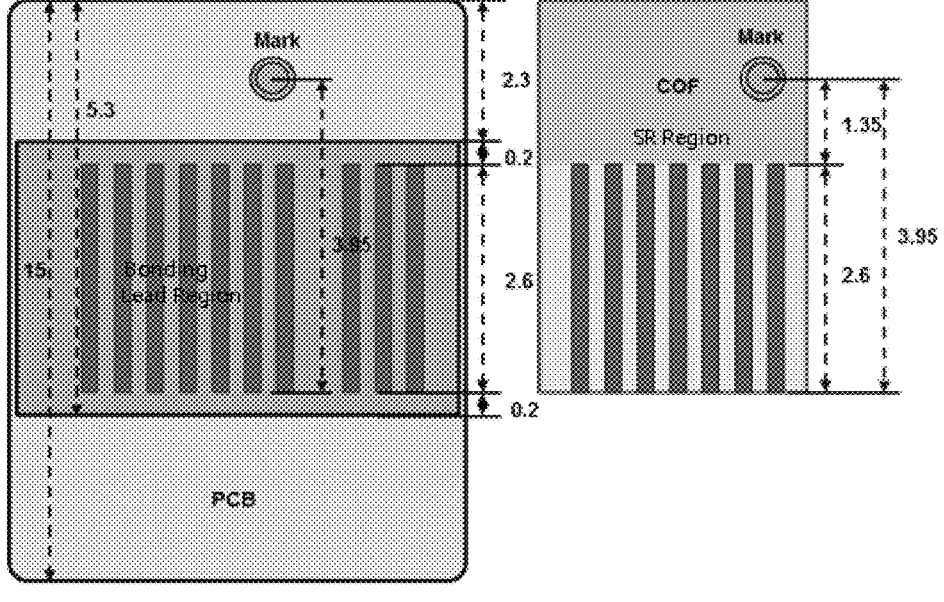
FIG. 1 is a schematic diagram of structures of a conventional circuit board and a conventional chip on film.

The conventional bonding design for a display apparatus is shown in FIG. 1. In the bonding process (Bonding), an alignment mark (Mark) on a chip on film (COF) and an alignment mark (Mark) on a printed circuit board (PCB) are aligned with each other, to complete an alignment between the circuit board and the chip on film in the bonding process. The circular alignment mark on the circuit board is located at an edge of the circuit board; an upper edge of the circuit board having a width (of 2.3 mm) in a large range is only used for accommodating the alignment mark, so that wires or pieces cannot be provided, and thus, a large amount of space is wasted. A width of the circuit board is at least 15 mm. A shape and a size of the mark on the chip on film are the same as those of the mark on the circuit board. With such the design, after the alignment in the bonding process, the alignment mark are covered, so that the inspection for the alignment is inconvenient during the alignment, and the inspection for the bonding quality after the bonding process is also inconvenient.

Figure 2:
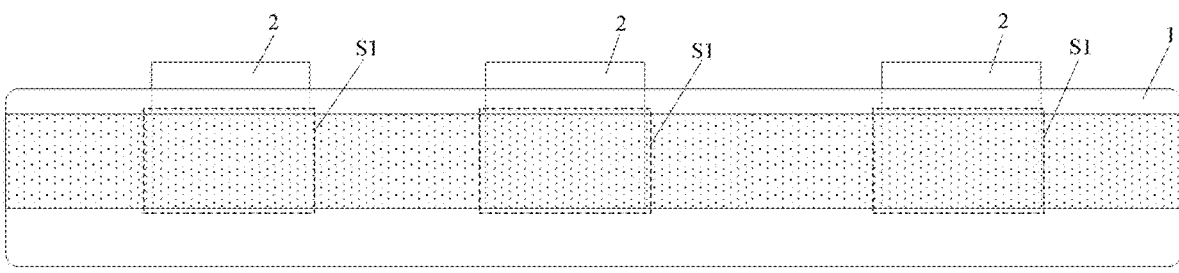
FIG. 2 is a schematic diagram illustrating a circuit board and a chip on film bonded together according to some embodiments of the present disclosure.
Figures 3, 4:
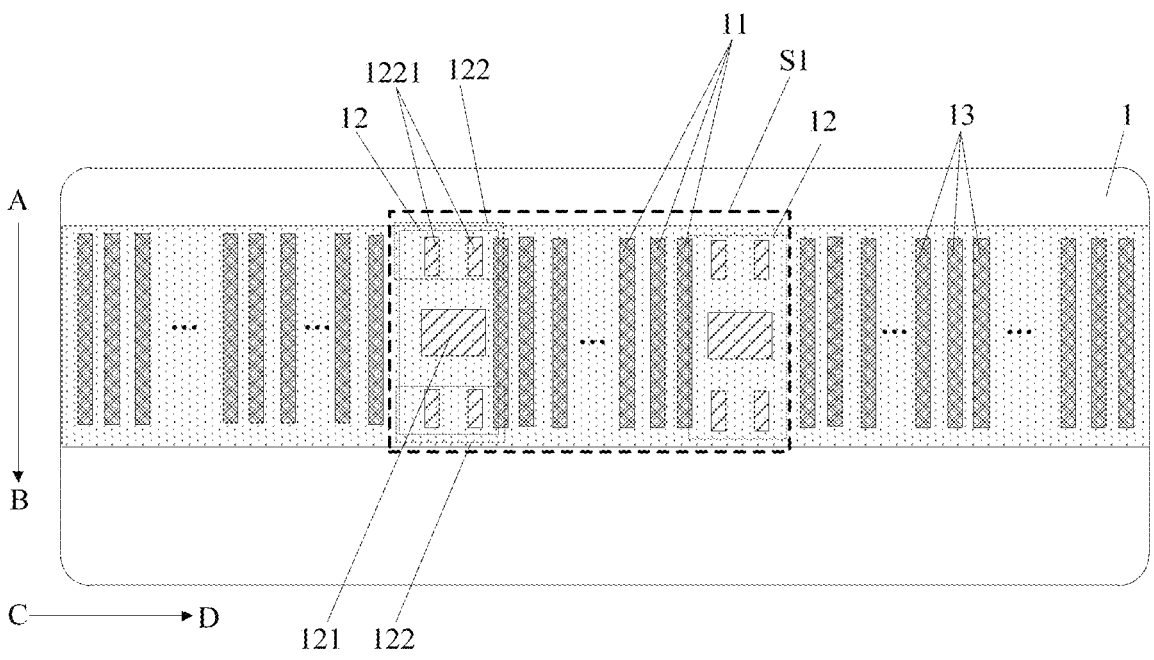
FIG. 3 is a schematic diagram of a circuit board according to some embodiments of the present disclosure.
FIG. 4 is a schematic diagram of a chip on film according to some embodiments of the present disclosure.
Figure 5:
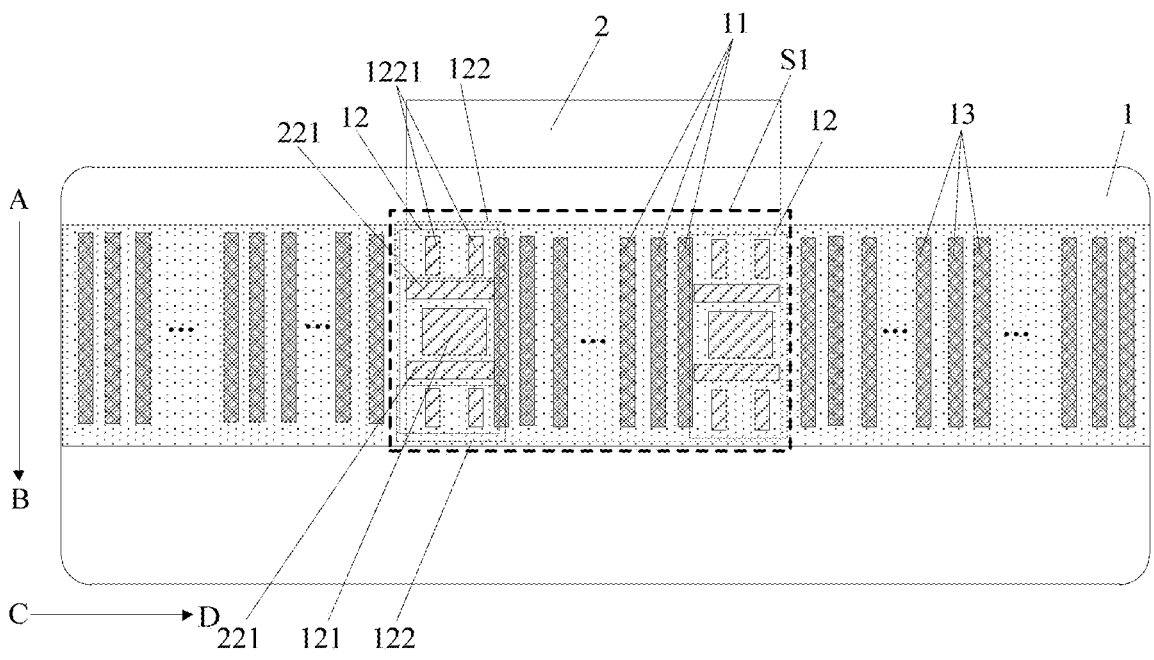
FIG. 5 is a schematic diagram illustrating a circuit board and a chip on film bonded together according to some embodiments of the present disclosure.

In view of this, the embodiments of the present disclosure provide a circuit board 1, referring to FIG. 2 to FIG. 5. FIG. 2 is a schematic diagram illustrating a circuit board 1 and a chip on film 2 bonded together; FIG. 3 is an enlarged schematic diagram of the circuit board 1; FIG. 4 is an enlarged schematic diagram of the chip on film 2: FIG. 5 is an enlarged schematic diagram of the circuit board 1 and the chip on film 2 aligned with each other: the circuit board 1 has a plurality of bonding regions S1 for bonding with the chip on film 2, where each bonding region S1 includes:

A plurality of first pins 11 extending along a first direction AB and sequentially arranged along a second direction CD:

At least one first alignment mark group 12 located on an arrangement path along which the first pins 11 are arranged and configured to be aligned with a second alignment mark group 22 of the chip on film 2 in a buckled way, so that the first pins 11 are bonded and attached to the second pins 21 of the chip on film 2 in one-to-one correspondence.

In the embodiments of the present disclosure, the circuit board includes the plurality of first pins and at least one first alignment mark group located on the arrangement path along which the first pins are arranged. In this way, the space of the circuit board can be saved and be better utilized, the width of the circuit board can be reduced, and the cost of the circuit board can be reduced compared with the first alignment mark group arranged in a region outside the first pins. In addition, the first alignment mark group and the second alignment mark group of the chip on film are designed to be in a buckled design, and projections of the first alignment mark group and the second alignment mark group do not overlap with each other, so that the alignment can be conveniently observed at any time, the success rate of bonding alignment can be increased, and the inspection after the alignment can be convenient.

In one possible embodiment, referring to FIG. 3 or FIG. 5, each first alignment mark group 12 includes a fixture block 121 and strip groups 122 respectively located on two sides of the fixture block 121 along the first direction AB. Each strip group 122 includes at least one first strip 1221 extending along the first direction AB. In the embodiments of the present disclosure, the first alignment mark group 12 includes the fixture block 121 and the strip groups 122 respectively located on two sides of the fixture block 121 along the first direction AB. When aligning with the second alignment mark group 22 of the chip on film, the projections of the first alignment mark group 12 and the second alignment mark group 22 do not overlap with each other, which is convenient for verifying the attaching effect.

In one possible embodiment, the fixture block 121 may have a rectangular shape, and each first strip 1221 may have a strip shape; the first strips 1221 of the same first alignment mark group 12 may have the same shape and size.

In a specific implementation, the circuit board 1 may have a structure with a certain transparency, and when the chip on film is attached to the circuit board, the alignment of the first alignment mark group 12 and the second alignment mark group 22 can be observed through the circuit board 1.

In one possible embodiment, as shown in FIGS. 3 and 5, the circuit board 1 includes two first alignment mark groups 12 respectively located in two edge regions of a bonding region S1 in the second direction CD. Specifically, as shown in FIG. 3, one of the first alignment mark groups 12 is located in the left edge of the bonding region S1, and the other first alignment mark group 12 is located in the right edge of the bonding region S1. In the embodiments of the present disclosure, the two first alignment mark groups 12 are respectively located in the two edge regions of the bonding region S1 in the second direction CD, so that the structure of the circuit board 1 can be slightly modified with a better bonding effect.

In one possible embodiment, the shapes, sizes, and numbers of the fixture blocks 121 included in the two first alignment mark groups 12 may be the same, and the numbers, shapes, and distribution positions of the first strips 1221 included in the two first alignment mark groups 12 may be the same.

Figure 6:
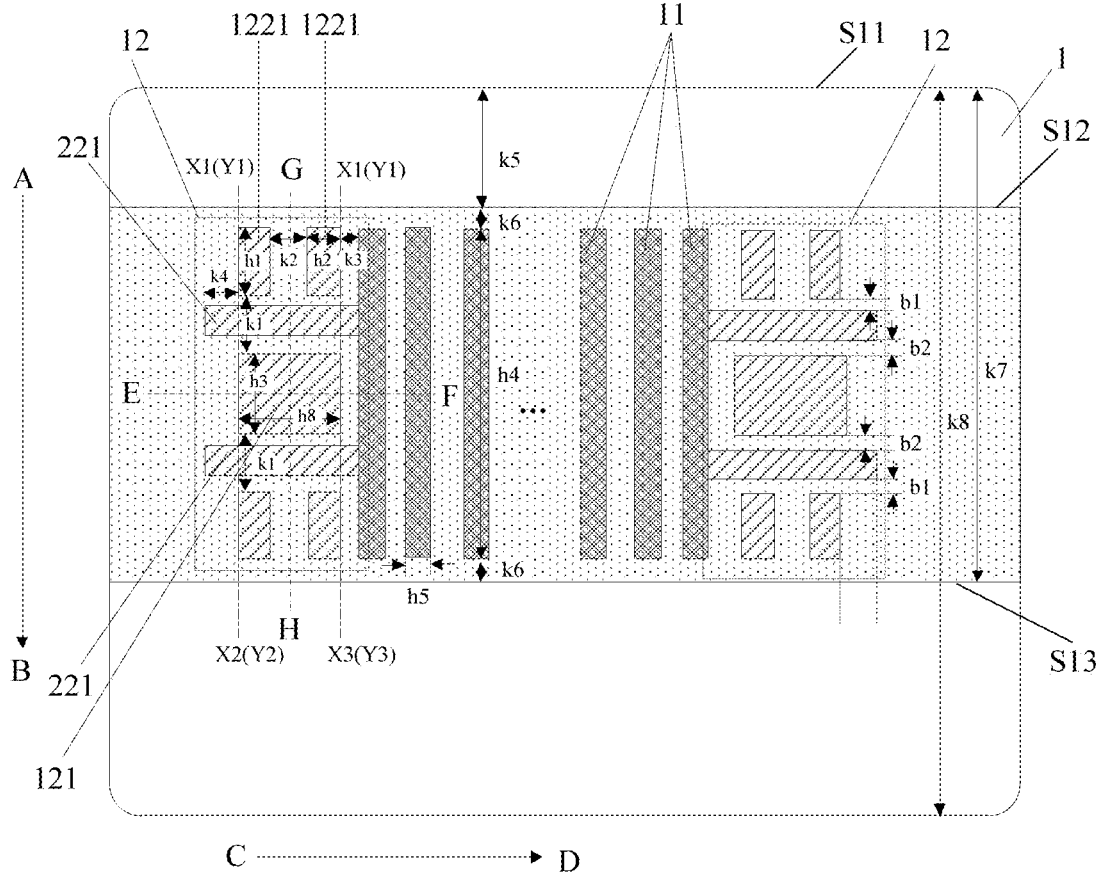
FIG. 6 is a schematic diagram illustrating a circuit board and a chip on film bonded together according to some embodiments of the present disclosure.

In one possible embodiment, referring to FIG. 6, FIG. 6 is an enlarged view of the bonding region S1. Each fixture block 121 has a first symmetry axis EF parallel to the second direction CD and passing through a center of the fixture block 121: the first strips 1221 on both sides of the fixture block 121 are symmetrically distributed about the first symmetry axis EF.

In one possible embodiment, referring to FIG. 6, each fixture block 121 has a second symmetry axis GH parallel to the first direction AB and passing through the center of the fixture block 121; the first strips 1221 of the same strip group 12 are symmetrically distributed about the second symmetry axis GH. In particular, for example, in FIG. 6, two first strips 1221 in the upper strip group 12 are symmetrically distributed about the second symmetry axis GH.

In one possible embodiment, as shown in FIGS. 3, 5 and 6, in the same strip group 12, ends of the first strips 1221 away from the fixture block 121 are substantially flush with each other. For example, specifically, as shown in FIG. 3, the upper ends of the first strips 1221 above the fixture block 121 are substantially flush with each other, and the lower ends of the first strips 1221 below the fixture block 121 are substantially flush with each other. In the same strip group 12, ends of the first strips 1221 close to the fixture block 121 are substantially flush with each other. For example, specifically, as shown in FIG. 3, the lower ends of the first strips 1221 above the fixture block 121 are substantially flush with each other, and the upper ends of the first strips 1221 below the fixture block 121 are substantially flush with each other.

In one possible embodiment, as shown in FIGS. 3, 5 and 6, in the same strip group 12, an end of each first strip 1221 away from the fixture block 121 is substantially flush with an end of each first pin 11. For example, specifically, as shown in FIG. 3, an upper end of each first strip 1221 above the fixture block 121 is substantially flush with an upper end of each first pin 11, and a lower end of each first strip 1221 below the fixture block 121 is substantially flush with a lower end of each first pin 11.

In one possible embodiment, as shown in FIGS. 3, 5, and 6, each strip group 12 includes two first strips 1221. In the same strip group 12, an extension line of an outer edge of one of the first strips 1221 away from the other first strip 1221 and parallel to the first direction AB, is substantially coincident with an extension line of an outer edge of the fixture block 121 parallel to the first direction AB. Specifically, for example, in the left strip group 12 as shown in FIG. 6, an extension line X1X2 of a left edge of the left first strip 1221 is substantially coincident with an extension line Y1Y2 of a left edge of the fixture block 121, and an extension line X1X3 of a right edge of the right first strip 1221 is substantially coincident with an extension line Y1Y3 of a right edge of the fixture block 121.

In one possible embodiment, as shown in FIG. 6, in the same strip group 12, lengths h1 of the first strips 1221 along the first direction AB are substantially the same; in the same strip group 12, lengths h2 of the first strips 1221 along the second direction CD are substantially the same. Specifically, the length h1 of each first strip 1221 along the first direction AB may be in a range from 0.5 mm to 0.7 mm, and specifically, may be 0.6 mm. Specifically, the length h2 of each first strip 1221 along the second direction CD may be in a range from 0.1 mm to 0.3 mm, and specifically, may be 0.2 mm.

In one possible embodiment, as shown in FIG. 6, a length h3 of the fixture block 121 in the first direction AB is substantially the same as a length h1 of the first strip 1221 in the first direction AB.

In one possible embodiment, as shown in FIG. 6, the length h3 of the fixture block 121 in the first direction AB is in a range from one fifth to one third of a length h4 of each first pin 11 in the first direction AB. Specifically, the length h4 of each first pin 11 in the first direction AB may be in a range from 2.5 mm to 2.7 mm, specifically, 2.6 mm.

Figure 7:
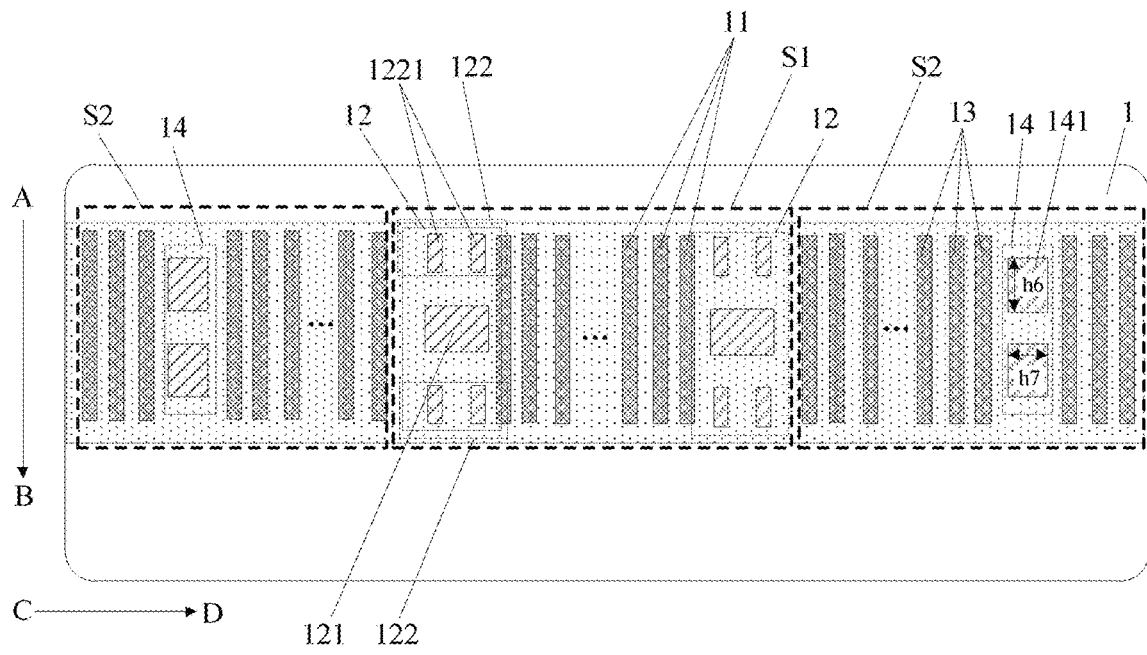
FIG. 7 is a schematic diagram of a circuit board according to some embodiments of the present disclosure.

In one possible embodiment, referring to FIG. 7, the circuit board 1 further includes extension regions S2 located on two sides of the bonding region S1, and each extension region S2 includes: a plurality of floating pins 13 extending along the first direction AB and arranged sequentially along the second direction CD, and at least one auxiliary mark group 14 located on an arrangement path along which the floating pins 13 are arranged. In the embodiments of the present disclosure, the circuit board 1 further includes the extension regions S2, and the floating pins 13 located in the extension regions S2, which is conducive to heat dissipation of the circuit board 1. In addition, the at least one auxiliary mark group 14 is arranged on the arrangement path along which the floating pins 13 are arranged, and the alignment can be further checked by observing whether a side edge of the auxiliary mark group 14 is parallel to a side edge of the chip on film 2. In this way, a more visual alignment checking effect is achieved, the auxiliary alignment is performed before and after attaching, and the attaching effect is checked from the outside after attaching.

In one possible embodiment, as shown in FIG. 7, the display apparatus includes two auxiliary mark groups 14 respectively located on two sides of the bonding region S1. Specifically, for example, as shown in FIG. 7, one auxiliary mark group 14 is located on the left side of the bonding region S1, and the other auxiliary mark group 14 is located on the right side of the bonding region S1: the auxiliary mark groups 14 are reused as glue coating mark groups, and conductive glue is coated between the two auxiliary mark groups 14. Each auxiliary mark group 14 is used as an external auxiliary alignment point of the bonding region S1, and is located, for example, after the 10th second pin 21 on a side of the extension region S2 close to the bonding region S1, and may be used as a reference position when glue is applied. The glue cannot be applied beyond the auxiliary mark group 14, so that the position where the glue is applied can be calibrated, and the glue is more accurately applied.

In one possible embodiment, as shown in FIG. 7, each auxiliary mark group 14 includes two rectangular auxiliary mark blocks 141 arranged along the first direction AB.

In one possible embodiment, as shown in FIGS. 6 and 7, a length h6 of each auxiliary mark block 141 in the first direction AB is in a range from one fifth to one third of the length h4 of each first pin 11 in the first direction AB; a width h7 of each auxiliary mark block 141 in the second direction CD is greater than a width h5 of each first pin 11 in the second direction CD.

In one possible embodiment, the number of floating pins 13 between each auxiliary mark group 14 and the bonding region S1 may be in a range from 8 to 12.

The embodiments of the present disclosure further provide a chip on film 2, as shown in FIG. 4, FIG. 5 and FIG. 6, including:

A plurality of second pins 21 extending along the first direction AB and sequentially arranged along the second direction CD:

At least one second alignment mark group 22 located on the arrangement path along the second pins 21 are arranged.

In the chip on film 2 of the embodiments of the present disclosure, the at least one second alignment mark group 22 is located on the arrangement path along which the second pins 21 are arranged, and corresponds to the circuit board provided in the embodiments of the present disclosure. When the circuit board is attached to the chip on film, the space of the circuit board can be saved and be better utilized, the width of the circuit board can be reduced, and the cost of the circuit board can be reduced.

In one possible embodiment, the number of the first pins 11 in the bonding region S1 may be in a range from 100 to 120, specifically, may be 110. With such the greater number, the width h5 of each first pin 11 in a direction parallel to the second direction CD is approximately 0.2 mm, which is required to have a higher attaching precision. However, the first alignment mark group 12 and the second alignment mark group 22 provided in the embodiments of the present disclosure may implement the higher attaching precision.

In one possible embodiment, as shown in FIG. 4, each second alignment mark group 22 includes two second strips 221 extending along the second direction CD, and one end of each second strip 221 is connected to the same second pin 21. In the embodiments of the present disclosure, the second strips 221 are connected to the second pins 21, and one end of each second strip 221 is connected to the same second pin 21, so that the relative positions of the second strips 221 and the second pins 21 can be ensured. After the first alignment mark group 12 is aligned with the second alignment mark group 22, it can be ensured that the second pin 21 at the outermost edge of the chip on film 2 is aligned with the first pin 11 at the outermost edge of the circuit board 1.

In one possible embodiment, the chip on film 2 includes two second alignment mark groups 22 respectively located in two edge regions of the chip on film 2 in the second direction CD. Specifically, for example, one of the second alignment mark groups 22 is located in the left edge of the chip on film 2 in the second direction CD, and the other second alignment mark group 22 is located in the right edge of the chip on film 2 in the second direction CD. In the embodiments of the present disclosure, the two second alignment mark groups 22 are respectively located in two edge regions of the chip on film 2 in the second direction CD, so that the original layout for pins of the chip on film can be slightly modified with a better bonding effect.

In one possible embodiment, as shown in FIG. 4, the second strips 221 are connected to the second pin 21 at the edge of the chip on film 2, and the second pin 21 and the second strips 221 form a notch with an opening towards the side edge of the chip on film 2.

In one possible embodiment, as shown in FIG. 4, the other end of each second strip 221 is substantially flush with the edge of the chip on film 2.

In one possible embodiment, as shown in FIG. 4, the second alignment mark group 22 includes two second strips 221.

In one possible embodiment, as shown in FIG. 4, a width a1 of each second strip 221 in the first direction AB is substantially the same as a width a5 of each second pin 21 in the second direction CD.

The embodiments of the present disclosure further provide a display apparatus, as shown in FIG. 4, FIG. 5, FIG. 6 and FIG. 7, including the circuit board 1 provided in the embodiments of the present disclosure, and the chip on film 2 provided in the embodiments of the present disclosure. The first alignment mark group 12 of the circuit board 1 and the second alignment mark group 22 of the chip on film 2 are aligned with each other in a buckled way, so that the first pins 11 of the circuit board 1 are bonded and attached to the second pins 21 of the chip on film 2 in one-to-one correspondence.

In one possible embodiment, as shown in FIGS. 4, 5, 6 and 7, each first alignment mark group 12 includes the fixture block 121 and strip groups 122 respectively located on two sides of the fixture block 121 along the first direction AB. Each strip group 122 includes at least one first strip 1221 extending along the first direction AB. Each second alignment mark group 22 includes two second strips 221 extending along the second direction CD, and one end of each second strip 221 is connected to the same second pin 21. When the first alignment mark group 12 and the second alignment mark group 22 are aligned with each other in a buckled way, the fixture block 121 is located between the adjacent second strips 221, and each second strip 221 is located between the fixture block 121 and the first strip 1221.

In one possible embodiment, as shown in FIGS. 4 and 6, a length a4 of each second strip 221 in the second direction CD is greater than a length h8 of the fixture block 121 in the second direction CD: a distance a2 (of a gap) between the two second strips 221 in the first direction AB is greater than a length h3 of the fixture block 121 in the first direction AB.

In one possible embodiment, as shown in FIGS. 4 and 6, a width k1 of a gap between the first strip 1221 and the fixture block 121 in the first direction AB is greater than the width a1 of each second strip 221 in the first direction AB.

In one possible embodiment, as shown in FIG. 2, every adjacent N chip on films 2 are bonded to the same circuit board 1, where N is a positive integer greater than 0. Specifically. N may be 3.

Figure 8:
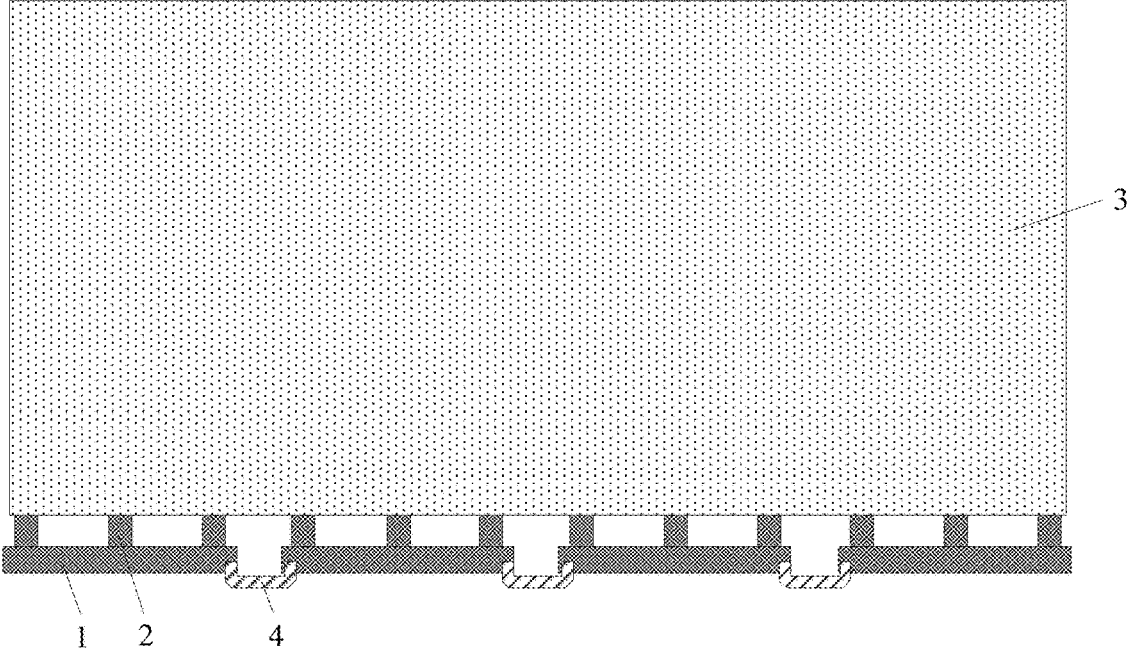
FIG. 8 is a schematic diagram of a display apparatus according to some embodiments of the present disclosure.

In one possible embodiment, as shown in FIG. 8, the display apparatus further includes a display panel 3, and a flexible circuit board 4; the display panel 3 is connected to one end of the chip on film 2: adjacent circuit boards 1 are connected to each other by the flexible circuit board 4.

In one possible embodiment, as shown in FIGS. 4 and 6, the length h5 of each first pin 11 in the direction parallel to the second direction CD may be in a range from 0.1 mm to 0.3 mm, and specifically, may be 0.2 mm: a distance k1 of a gap between the fixture block 121 and the first strip 121 in the direction parallel to the second direction CD may be in a range from 0.3 mm to 0.5 mm, specifically, may be 0.4 mm; in the same strip group 12, a distance k2 of a gap between two adjacent first strips 121 in the direction parallel to the first direction AB may be the same as the length h2 of the first strip 1221 in the direction parallel to the second direction CD, specifically, k2 may be in a range from 0.1 mm to 0.3 mm, specifically, may be 0.2 mm. Specifically, a distance k3 of a gap between the first pin 11 connected to the second strip 221 and the adjacent first strip 1221 in the direction parallel to the second direction may be in a range from 0.05 mm to 0.15 mm, specifically. 0.1 mm; specifically, a distance k4 of a gap between an edge of the first strip 1221, away from the first pin 11 and parallel to the first direction AB in the first strip group 122, and an end of the second strip 221 in a direction parallel to the second direction CD may be in a range from 0.05 mm to 0.15 mm, and specifically, 0.1 mm. Specifically, a distance k5 between a first edge S11 of the bonding region S1 and a second edge S12 of the circuit board 1 in the first direction may be in a range from 0.9 mm to 1.1 mm, specifically, may be 1.0 mm, where the first edge S11 may be an edge of the circuit board 1 close to the display panel 3, and the second edge S12 may be an edge of the bonding region S1 close to the display panel 3; a distance k6 between the second edge S12 of the bonding region S1 and the end of the first pin 11 in the first direction AB may be in a range from 0.1 mm to 0.3 mm, specifically. 0.2 mm: specifically, the distance k7 of a gap between the first edge S11 of the circuit board 1 and the third edge S13 of the bonding region S1 in the first direction AB may be in a range from 3.5 mm to 4.0 mm, and specifically, may be 3.8 mm, where the third edge S13 may be an edge of the bonding region S1 away from the display panel 3. Specifically, a length k8 of the circuit board 1 in a direction parallel to the first direction AB may be in a range from 13 mm to 14 mm, and specifically, may be 13.5 mm; specifically, a distance b1 of a gap between the first strip 1221 and the second strip 221 in a direction parallel to the first direction AB may be in a range from 0.05 mm to 0.15 mm, and specifically, may be 0.1 mm: a distance b2 of a gap between the second strip 221 and the fixture block 121 in a direction parallel to the first direction AB may be in a range from 0.05 mm to 0.15 mm, specifically, 0.1 mm: specifically, a length a1 of the second strip 221 in the direction parallel to the first direction AB may be in a range from 0.1 mm to 0.3 mm, specifically, may be 0.2 mm; specifically, a distance a2 of a gap between two adjacent second strips 221 in the direction parallel to the first direction AB may be in a range from 0.7 mm to 0.9 mm, specifically, 0.8 mm; specifically, a minimum distance a3 between the second strip 221 and the edge of the bonding region S1 in the direction parallel to the first direction AB may be in a range from 0.6 mm to 0.8 mm, specifically. 0.7 mm; specifically, a length a4 of the second strip 221 in the direction parallel to the second direction CD may be in a range from 0.7 mm to 0.9 mm, and specifically, may be 0.8 mm.

The embodiments of the present disclosure further provide a bonding method for the display apparatus as provided in the embodiments of the present disclosure, as shown in FIG. 9, including:

Step S100, providing the circuit board provided by the embodiments of the present disclosure;

Step S200, providing the chip on film provided by the embodiments of the present disclosure:

Step S300, aligning the first alignment mark group of the circuit board with the second alignment mark group of the chip on film in a buckled way, so that the first pins of the circuit board are bonded and attached to the second pins of the chip on film in one-to-one correspondence.

In one possible embodiment, as shown in FIG. 10, the circuit board further includes two auxiliary mark groups; before step S300, that is, before the step of aligning the first alignment mark group of the circuit board with the second alignment mark group of the chip on film in a buckled way, the bonding method further includes: step S400, coating conductive glue on an extension region and a bonding region between the two auxiliary mark groups.

After step S300, that is, after the step of aligning the first alignment mark group of the circuit board with the second alignment mark group of the chip on film in a buckled way, the bonding method further includes: attaching the circuit board to the chip on film.

While the preferred embodiments of the present disclosure have been described, additional variations and modifications in those embodiments may occur to one of ordinary skill in the art once learning the basic inventive concepts. Therefore, the claims are intended to be interpreted as including the preferred embodiments and all changes and modifications that fall within the scope of the present disclosure.

It will be apparent to one of ordinary skill in the art that various changes and modifications may be made in the embodiments of the present disclosure without departing from the spirit and scope of the present disclosure. Thus, if such changes and modifications of the embodiments of the present disclosure are within the scope of the claims and their equivalents of the present disclosure, the present disclosure is also intended to encompass such changes and modifications.

What is claimed is:

1. A circuit board, having a plurality of bonding regions for bonding with a chip on film, wherein each bonding region comprises:
a plurality of first pins extending along a first direction and sequentially arranged along a second direction; and
at least one first alignment mark group on an arrangement path along which the plurality of first pins are arranged and configured to be aligned with a second alignment mark group of the chip on film in a buckled way, so that the plurality of first pins are bonded and attached to second pins of the chip on film in one-to-one correspondence.

2. The circuit board according to claim 1, wherein each first alignment mark group comprises a fixture block and strip groups respectively located on two sides of the fixture block along the first direction; each strip group comprises at least one first strip extending along the first direction.

3. The circuit board according to claim 2, wherein the circuit board comprises two first alignment mark groups respectively on two edge regions of the bonding region in the second direction.

4. The circuit board according to claim 2, wherein the fixture block has a first symmetry axis parallel to the second direction and passing through a center of the fixture block; first strips on two sides of the fixture block are symmetrically distributed about the first symmetry axis; and
wherein the fixture block has a second symmetry axis parallel to the first direction and passing through a center of the fixture block; the first strips of a same strip group are symmetrically distributed about the second symmetry axis.

5. The circuit board according to claim 2, wherein in a same strip group, ends of the first strips away from the fixture block are substantially flush with each other; in a same strip group, ends of the first strips close to the fixture block are substantially flush with each other; and
wherein in a same strip group, an end of each first strip away from the fixture block is substantially flush with an end of each first pin.

6. The circuit board according to claim 2, wherein each strip group comprises two first strips; in a same strip group, an extension line of an outer edge of one of the first strips away from the other first strip and parallel to the first direction is substantially coincident with an extension line of an outer edge of the fixture block parallel to the first direction; and
wherein in a same strip group, lengths of the first strips along the first direction are substantially the same; in a same strip group, lengths of the first strips along the second direction are substantially the same.

7. The circuit board according to claim 6, wherein a length of the fixture block in the first direction is substantially the same as a length of each first strip in the first direction; and
the length of the fixture block in the first direction is in a range from one fifth to one third of the length of each first pin in the first direction.

8. The circuit board according to claim 1, wherein the circuit board further comprises extension regions on both two sides of the bonding region; each extension region comprises: a plurality of floating pins extending along the first direction and sequentially arranged along the second direction, and at least one auxiliary mark group on an arrangement path along which the plurality of floating pins are arranged.

9. The circuit board according to claim 8, wherein the circuit board comprises two auxiliary mark groups respectively on two sides of the bonding region; the auxiliary mark groups are used as glue coating mark groups, and conductive glue is coated between the two auxiliary mark groups.

10. The circuit board according to claim 9, wherein each auxiliary mark group comprises two auxiliary mark blocks arranged in the first direction which are rectangular; and
wherein a length of each auxiliary mark block in the first direction is in a range from one fifth to one third of the length of each first pin in the first direction; a width of each auxiliary mark block in the second direction is greater than a width of each first pin in the second direction.

11. A chip on film for bonding with a circuit board having a plurality of bonding regions, wherein each bonding region comprises: a plurality of first pins extending along a first direction and sequentially arranged along a second direction; and at least one first alignment mark group on an arrangement path along which the plurality of first pins are arranged, and the chip on film comprises:
a plurality of second pins extending along the first direction and sequentially arranged along the second direction; and
at least one second alignment mark group on an arrangement path along which the plurality of second pins are arranged,
wherein the at least one first alignment mark group is configured to be aligned with the at least one second alignment mark group in a buckled way, so that the plurality of first pins are bonded and attached to the plurality of second pins in one-to-one correspondence.

12. The chip on film according to claim 11, wherein each second alignment mark group comprises two second strips extending along the second direction, and one end of each second strip is connected to a same second pin; and
wherein the other end of each second strip is substantially flush with an edge of the chip on film.

13. The chip on film according to claim 12, wherein the chip on film comprises two second alignment mark groups respectively in two edge regions of the chip on film in the second direction; and
wherein the second strips are connected to a second pin at an edge of the chip on film, and the second pin and the second strips form a notch with an opening towards a side edge of the chip on film.

13                                        14

14. The chip on film according to claim 12, wherein each second alignment mark group comprises two second strips; and a width of each second strip in the first direction is substantially the same as a width of each second pin in the second direction.

15. A display apparatus, comprising the circuit board according to claim 1 and a chip on film, which comprises: a plurality of second pins extending along the first direction and sequentially arranged along the second direction; and at least one second alignment mark group on an arrangement path along which the plurality of second pins are arranged; and wherein the first alignment mark group of the circuit board and the second alignment mark group of the chip on film are aligned with each other in a buckled way, so that the plurality of first pins of the circuit board are bonded and attached to the plurality of second pins of the chip on film in one-to-one correspondence.

16. The display apparatus according to claim 15, wherein each first alignment mark group comprises a fixture block and strip groups respectively located on two sides of the fixture block along the first direction; each strip group comprises at least one first strip extending along the first direction;

each second alignment mark group comprises two second strips extending along the second direction, and one end of each second strip is connected to a same second pin; and when the first alignment mark group and the second alignment mark group are aligned with each other in a buckled way, the fixture block is between the two second strips which are adjacent to each other, and each second strip is between the fixture block and the corresponding first strip.

17. The display apparatus according to claim 16, wherein a length of each second strip in the second direction is greater than a length of the fixture block in the second direction; and a distance of a gap between the two second strips in the first direction is greater than a length of the fixture block in the first direction; and wherein a width of a gap between the first strip and the fixture block in the first direction is greater than a width of each second strip in the first direction.

18. The display apparatus according to claim 15, wherein every adjacent N chip on films are bonded to a same circuit board, where N is a positive integer greater than 0; and wherein the display apparatus further comprises a display panel, and a flexible circuit board; the display panel is connected to one end of each chip on film; and two adjacent circuit boards are connected to each other through the flexible circuit board.

19. A bonding method for the display apparatus according to claim 15, comprising:

providing the circuit board;

providing the chip on film; and aligning the first alignment mark group of the circuit board with the second alignment mark group of the chip on film in a buckled way, so that the plurality of first pins of the circuit board are bonded and attached to the plurality of second pins of the chip on film in one-to-one correspondence.

20. The bonding method according to claim 19, wherein the circuit board further comprises two auxiliary mark groups; before the aligning the first alignment mark group of the circuit board with the second alignment mark group of the chip on film in a buckled way, the bonding method further comprises: coating conductive glue on an extension region and the bonding region between the two auxiliary mark groups;

after the aligning the first alignment mark group of the circuit board with the second alignment mark group of the chip on film in a buckled way, the bonding method further comprises: attaching the circuit board to the chip on film.

* * * * *